United States Patent [19]
Moore et al.

[11] Patent Number: 5,666,272
[45] Date of Patent: Sep. 9, 1997

[54] DETACHABLE MODULE/BALL GRID ARRAY PACKAGE

[75] Inventors: Dale Thomas Moore, Plano; Frank Sigmund, Coppell; Fred Chevreton, Carrollton, all of Tex.

[73] Assignee: SGS-Thomson Microelectronics, Inc., Carrollton, Tex.

[21] Appl. No.: 656,700

[22] Filed: Jun. 3, 1996

Related U.S. Application Data

[63] Continuation of Ser. No. 346,411, Nov. 29, 1994, abandoned.
[51] Int. Cl.⁶ .................. H05K 7/02; H05K 1/11; H01R 9/09
[52] U.S. Cl. .................. 361/735; 257/678; 257/737; 257/686; 361/729; 361/733; 361/776; 361/803; 361/807; 361/809
[58] Field of Search .................. 174/52.1, 52.4; 257/678, 685, 686, 684, 704, 723, 724, 731, 777, 697, 737; 361/743, 744, 760, 761, 762-764, 767-770, 772, 773, 774, 782, 783, 784, 790-795, 807, 809, 811, 820, 735, 729, 776, 733, 803; 439/68, 70-72, 83

[56] References Cited

U.S. PATENT DOCUMENTS

| | | | |
|---|---|---|---|
| 4,882,657 | 11/1989 | Braun | 361/790 |
| 5,119,269 | 6/1992 | Nakayama | 361/820 |
| 5,172,303 | 12/1992 | Bernardoni et al. | 361/792 |
| 5,222,014 | 6/1993 | Lin | 361/792 |
| 5,376,825 | 12/1994 | Tukamoto et al. | 257/685 |
| 5,403,782 | 4/1995 | Dixon et al. | 437/220 |

FOREIGN PATENT DOCUMENTS

| | | | |
|---|---|---|---|
| 3730325 | 3/1989 | Germany | 361/782 |
| 57-10260 | 1/1982 | Japan | 257/724 |
| 60-22348 | 2/1985 | Japan | 257/724 |
| 60-167452 | 8/1985 | Japan | 257/686 |
| 6-85164 | 3/1994 | Japan | 257/697 |

*Primary Examiner*—Donald Sparks
*Attorney, Agent, or Firm*—Theodore E. Galanthay; Lisa K. Jorgenson

[57] ABSTRACT

A system for packaging integrated circuit components including a ball grid array substrate with a plurality of solder balls coupled to the substrate. A semiconductor device is mounted on the substrate and electrically coupled to the solder balls. One or more terminals are coupled to the substrate and electrically coupled to said semiconductor device. A detachable module contains auxiliary component, such as a data acquisition device, a wireless communications device, an output device or driving devices for a clock circuit. The module comprises a body portion for containing the component and one or more electrical connectors for mating with respective terminals to hold the module to the substrate and to electrically couple the component with the semiconductor device.

36 Claims, 4 Drawing Sheets

DETACHABLE MODULE/BALL GRID ARRAY PACKAGE

This application is a file-wrapper continuation of application Ser. No. 08/346,411, filed Nov. 29, 1994 and now abandoned.

CROSS-REFERENCE TO OTHER APPLICATIONS

This application is related to U.S. application Ser. No. 08/114,750, entitled "Surface Mountable Integrated Circuit Package With Detachable Module" to Siegel et al, filed Aug. 31, 1993 (Attorney Docket No. 93-C-53), U.S. application Ser. No. 08/225,227, entitled "Surface Mountable Integrated Circuit Package With Low-Profile Detachable Module", to Siegel et al, filed Apr. 8, 1994 (Attorney Docket No. 94-C-44), and to U.S. application Ser. No.08/346,499, entitled "Ball Grid Array Package with Detachable Module" to Bond et al, filed concurrently herewith (Attorney Docket No. 94-C-91), all of which are assigned to SGS-Thomson Microelectronics, Inc. and incorporated by reference herein.

TECHNICAL FIELD OF THE INVENTION

This invention relates in general to semiconductor packaging and more particularly to a ball grid array package and detachable module assembly.

BACKGROUND OF THE INVENTION

As the complexity of circuits grows, the need to increase the density of integrated circuits onto a PC (printed circuit) board increases a major advancement in the field of circuit board technology has been the advent of surface mount technology to attach and connect integrated circuit components onto printed circuit boards. As is known in the art, surface mountable integrated circuit packages allow connection of a package to a planar surface of a circuit board without the need for plated-through holes in the circuit board. Surface mount technology thus increases the theoretical component density of the circuit board, as well as the degrees of freedom available to the board designer, as the location of integrated circuit leads need only be considered for a single surface plane of a multi-layer circuit board, rather than for all planes of the board.

To meet the challenge of increased density of integrated circuits on a PC board, the BGA (ball grid array) integrated circuit package type has become popular in the field. Conventional BGA packages are similar in layout and arrangement to the PGA (pin grid array) packages, in providing an array of connections on the underside of the integrated circuitry packages. Instead of the pin connectors used in PGA packages, however, BGA packages utilize a solder ball located at each connector location. As is known in the art, the BGA package is attached to a printed circuit board by reflowing the solder balls to make connection to conductors at the surface of the printed circuit board. The BGA package provides the important advantage of being self-aligning, as the surface tension of the solder will tend to pull the BGA package into proper alignment with the corresponding conductors on the printed circuit board.

For background purposes, BGA packages of various types are known in the art, including those of "cavity-up" and "cavity-down" types. Conventional cavity-up BGA packages mount the integrated circuit chip face-up into a cavity (or onto the surface) of the package substrate, attach wire bonds between the package and the chip on this side, and then either transfer mold or otherwise dispense a plastic over the chip and bond wires to provide environmental protection to the chip and wires. The solder balls are provided on the side of the substrate opposite the chip, and the packaged chip is then mounted to the system printed circuit board. Conventional cavity-down integrated circuit packages mount the integrated circuit chip into the cavity of, or onto the surface of, the substrate, followed by attachment of bond wires thereto and molding of the plastic around the chip. In this type of package, the solder balls are provided on the same side of the substrate as the chip, so that the chip is disposed upside-down after attachment of the packaged chip to the circuit board.

A major disadvantage of using BGA packages is the amount of thermal and mechanical stress exerted on the package during the assembly procedure, relative to non-surface-mountable packages, such as dual in-line (DIP) and similar packages. The mounting of a dual-in-line integrated circuit package to a circuit board is accomplished by wave solder of the underside of the circuit board as the pins of the integrated circuit package extend through plated-through holes in the circuit board. Accordingly, the circuit board itself insulates the integrated circuit package body from the high solder temperatures and harsh chemicals to which the soldered lead tips are subjected. Since the leads of a BGA package are soldered at the same surface of the printed circuit board as the package, however, the BGA package and its contents are directly subjected to the high temperature, and to harsh chemicals used in the soldering process, such as flux, solder and cleaning solvents.

While the semiconductor device encapsulated within the BGA package are typically able to withstand the environmental stresses of the surface mounting process, other components which may be part of the package may not be sufficiently tolerant. In particular, the use of battery power for many electronic circuit functions has become available, primarily due to advances made in complementary metal-oxide-semiconductor (CMOS) fabrications and design technology. As is well known, CMOS integrated circuits are able to operate with extremely low active power requirements; in the case of CMOS memory devices, such as static random access memories (SRAMs), the power requirements for data retention are especially low. These low power requirements allow operation and data retention in electronic systems to be powered by conventional lithium batteries and other cell types, improving the portability and reliability of a modern system, without the need for a backup power supply on the system board itself. Unfortunately, conventional batteries are unable to reliably withstand the temperatures and chemical conditions to which an integrated circuit is subjected during surface mount assembly. Some types of batteries can be irreparably damaged by exposure to temperatures as low as 181 degrees Centigrade, which is below the temperature of certain solder used in the surface mount process. Other components, such as quartz crystal resonators used in connection with on-chip oscillators, are also vulnerable to these harsh environmental conditions.

In a "gull wing" surface mountable package, use of a removable module which attaches to the package has been proposed in U.S. application Ser. No. 08/114,750, entitled "Surface Mountable Integrated Circuit Package With Detachable Module" to Siegel et al, filed Aug. 31, 1993 (Attorney Docket No. 93-C-53) and U.S. application Ser. No. 08/225,227, entitled "Surface Mountable Integrated Circuit Package With Low-Profile Detachable Module", to Siegel et al, filed Apr. 8, 1994 (Attorney Docket No. 94-C-44), both assigned to SGS-Thomson Microelectronics, Inc. and incorporated by reference herein. BGA, however, typically have very little clearance above the system PC board to allow the use mechanical connecting means of the type described.

Therefore, a need has arisen in the industry for a BGA package which supports the use of components which cannot withstand the environmental stress of surface mounting processes.

SUMMARY OF THE INVENTION

In one aspect of the present invention, an integrated circuit package comprises an lower module for attachment to a printed circuit board and an upper module which is detachable connected to the lower module. The upper module comprises a housing, a data acquisition component disposed within the housing and upper module connection circuitry for providing electrical connections to the data acquisition component. The lower module comprises a substrate, a processing circuit coupled to the substrate and lower module connection circuitry electrically coupled to the processing circuit for providing detachable connections with the upper module connection circuitry.

In another aspect of the present invention, an integrated circuit package comprises an lower module for attachment to a printed circuit board and an upper module which is detachable connected to the lower module. The upper module comprises a housing, a communications device within the housing and upper module connection circuitry for providing electrical connections to the communications device. The lower module comprises a substrate, a processing circuit coupled to the substrate and lower module connection circuitry electrically coupled to the processing circuit for providing detachable connections with the upper module connection circuitry.

In yet another aspect of the present invention, an integrated circuit package comprises an lower module for attachment to a printed circuit board and an upper module which is detachable connected to the lower module. The upper module comprises a housing, an output device within the housing and upper module connection circuitry for providing electrical connections to the output device. The lower module comprises a substrate, a processing circuit coupled to the substrate and lower module connection circuitry electrically coupled to the processing circuit for providing detachable connections with the upper module connection circuitry.

In a further aspect of the present invention, an integrated circuit package comprises an lower module for attachment to a printed circuit board and an upper module which is detachable connected to the lower module. The upper module comprises a housing, a battery, real time clock crystal and system clock crystal within the housing, and upper module connection circuitry for providing electrical connections to the battery and crystals. The lower module comprises a substrate, a processing circuit coupled to the substrate and lower module connection circuitry electrically coupled to the processing circuit for providing detachable connections with the upper module connection circuitry.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
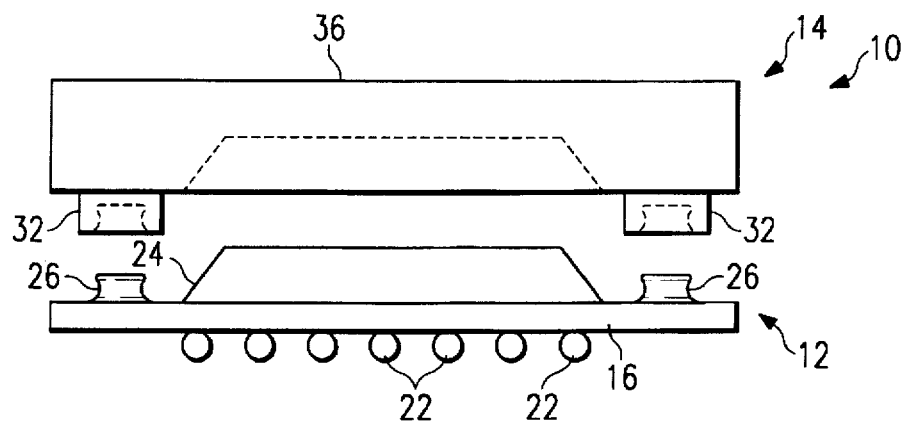
FIGS. 1a and 1b illustrate a front and cross sectional views of a preferred embodiment of a ball grid array package incorporating a detachable module.
Figure 1B:
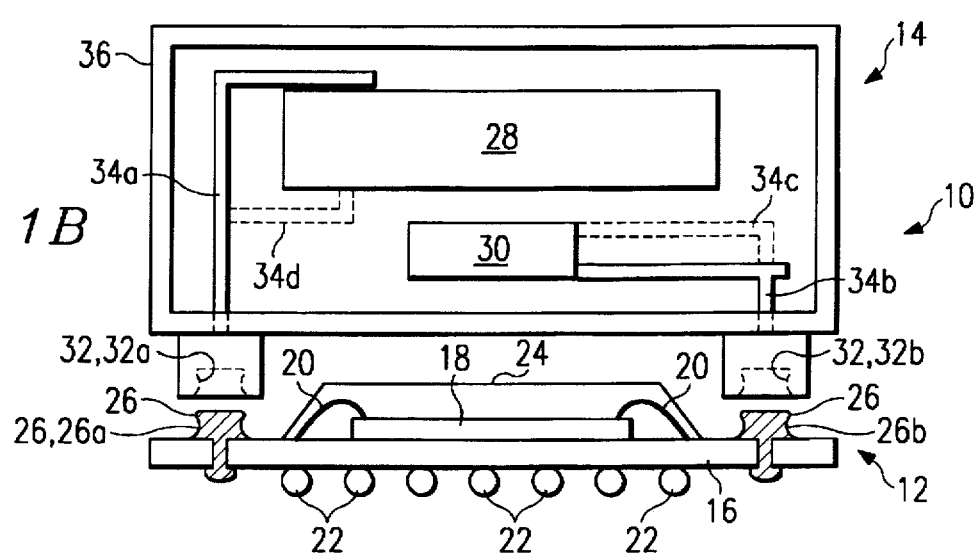

Referring to FIGS. 1a and 1b, front and cross sectional views of a ball grid array package having a detachable module are shown. The overall package 10 is designed for incorporation in a printed circuit board using standard techniques. The package 10 includes a lower module 12 and a upper module 14. The lower module 12 includes the substrate 16, which has an semiconductor chip 18 attached thereto using conventional die attach techniques, such as conductive epoxy or eutectic mounts. The semiconductor chip 18 (hereinafter "chip" 18) may be a solid-state integrated circuit such as a microprocessor, memory, logic device, analog device, or other electronic function implemented in a single-chip or multiple-chip integrated circuit, as is known in the art. The integrated circuit is coupled to the substrate using bond wires 20.

Substrate 16 may be a ceramic substrate, printed circuit board, or other similar substrate having a conducting interconnect system formed thereon or therewithin for carrying electrical signals to and from chip 18. The bond wires 20 connect bond pads on the chip 18 to the conducting interconnect system on the substrate. The conducting interconnect system is coupled to the solder balls 22 on the lower surface of substrate 16 on the lower surface of substrate 16. The solder balls 22 may be formed using conventional techniques, for example by way of a solder mask. The chip 18 and bond wires 20 are covered by encapsulant 24, which may be for example, a plastic mold compound, epoxy, potting compound or other conventional integrated circuit encapsulant.

Figure 2:
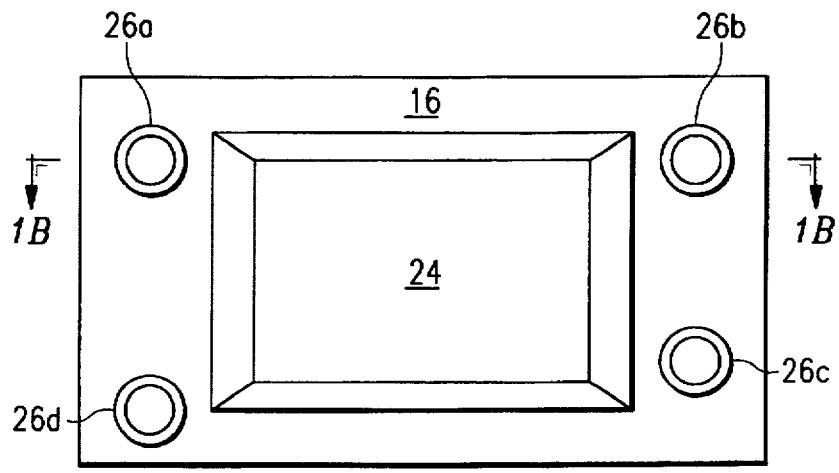
FIG. 2 illustrates a top view of the ball grid array substrate with an encapsulated semiconductor device.

Connectors 26a–26d (referred to generally as connectors 26) are disposed on the substrate 16 to couple the upper module 14 to the lower module 12 (se also FIG. 2). In the preferred embodiment, connectors 26 perform both the mechanical connection, to firmly attach upper module 14 to lower module 12, and the electrical connection, to couple components in the upper module 14 to the chip 18. As illustrated in FIG. 1b, the connectors 26 have an hourglass shape upon which a cooperating connector may be disposed. As shown in FIG. 1b, the connectors 26 are disposed through substrate 16, where they are coupled to the interconnect structure of the substrate. Alternatively, the connectors 26 could be coupled to the interconnect structure of the substrate on the top surface or at an intermediate level, where the substrate is multi-layered.

The upper module 14 contains components which are either replaceable, subject to failure due to thermal and mechanical stress exerted on the package during the assembly procedure, or both. For example, the upper module 14 shown in FIG. 1b contains a first component 28 and a second component 30. Connectors 32a–32d connect to corresponding connectors 26a–26d to form mechanical and electrical connections. In the preferred embodiment, connectors 32 comprise a plurality of spring arranged in a cylindrical fashion such that when in a expanded form, the springs form an hourglass shape corresponding to connectors 26. Lead tabs 34a and 34d are coupled between the first component 28 and respective connectors 32a and 32d. Lead tabs 34b and 34c are coupled between the second component and respective connectors 32b and 32b. The first component 28, second component 30, connectors 32 and lead tabs 34 are housed within body 36.

The package 10 will normally be attached to a printed circuit board as follows. First, lower module 12 will be mounted to the circuit board by surface mounting or other conventional method, along with the other integrated circuits which populate the circuit board. After performing the surface mount, using as vapor phase reflow, convection, IR (infra-red) heating or other suitable technique, the upper module 14 is then connected to the lower module 12 through respective connectors 26 and 32, which form a physical and an electrical connection between the two modules.

Accordingly, the contents of upper module 14 are not exposed to solder, flux, solvents and temperature extremes during the surface mount process, as is lower module 12. As a result, the reliability of the contents of the upper module 14 will not be degraded by the surface mount process. Additionally, the upper module 14 may be easily replaced as necessary by pulling upper module 14 from lower module 12 to disengage connectors 26 and 32. Replacement of the upper module 14 can thus be accomplished without requiring the removal of the package 10 from the circuit board to which it is attached. Also, if the circuit board requires additional soldering, the upper module can be removed and then replaced after the soldering is finished.

Figure 3:
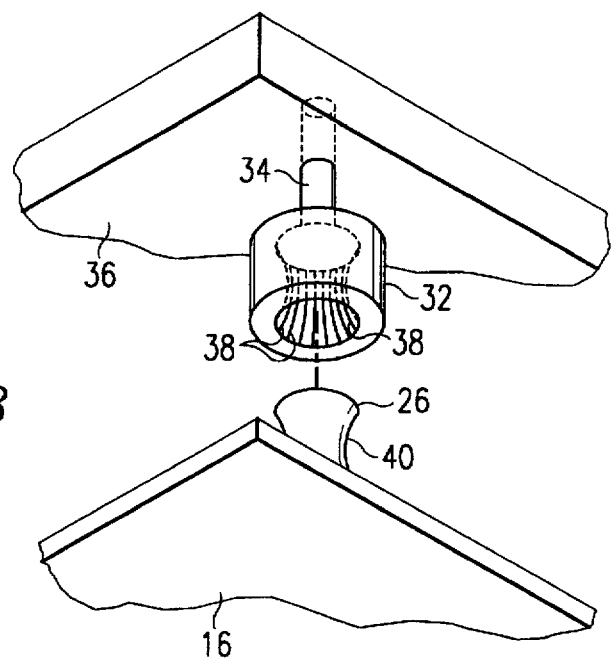
FIG. 3 illustrates a preferred embodiment of connectors for coupling upper and lower modules of the package.

FIG. 3 illustrates one embodiment of the connectors 26 and 32 in greater detail. Connectors 26 are substantially hour glass shaped. Connectors 32 comprise a plurality of springs 38 which form an hour glass shape generally corresponding to the shape of connectors 26 when the springs are in an expanded orientation. When connectors 26 are inserted into connectors 32, the springs 38 compress into a generally cylindrical formation until allowed to expand into the narrow portion 40 of connectors 26. It should be noted that the combination of connectors 26 and 32 is but one of a large number of connectors which could be used to hold upper module 14 to lower module 12.

FIGS. 4a–4d illustrate one embodiment of the present invention wherein the upper module 14 contains one or more components 42 for acquiring data and the lower component contains circuitry for processing and/or storing the data 44. While the packages 10 of FIGS. 4a–4d are shown with a single data acquisition component 42 housed therein, it is apparent that multiple data acquisition components or 42 combinations of data acquisition components 42 and other components could be stored in a single upper module 14.

Figure 4A:
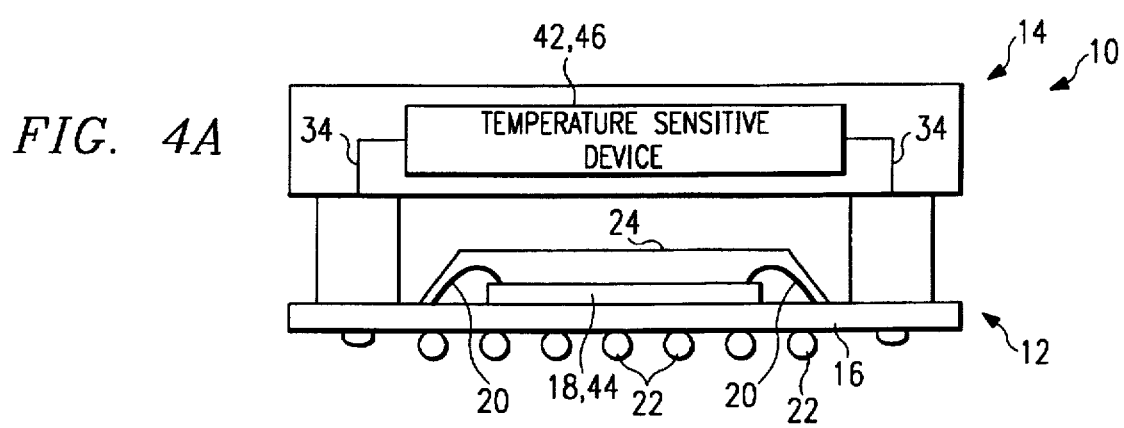
FIGS. 4a–4d illustrate cross sectional views of packages incorporating a data acquisition device in the upper module of the package.

FIG. 4a illustrates a cross-sectional view of a package 10 having an upper module 14 including a temperature sensitive device 46, such as a thermocoupler or thermistor. The temperature sensitive device 46 is coupled to the chip 18 through connectors 26 and 32 and leads 34. The temperature sensitive device 46 could be used in conjunction with the circuitry 18, for example, to power down a circuit when a dangerous temperature is reached inside the circuit housing or to enable additional cooling measures such as auxiliary fans. Furthermore, the temperature sensitive device could be used in commercial air conditioning equipment to regulate temperature.

Figure 4B:
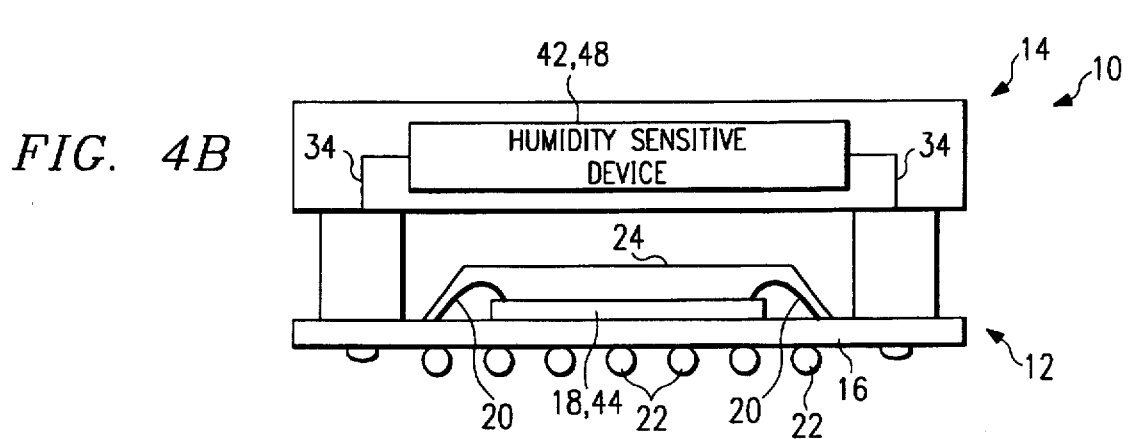

FIG. 4b illustrates a cross-sectional view of a package 10 having an upper module 14 including a humidity sensitive device 48, such as a humidity meter. The humidity meter 48 is coupled to the chip 18 through connectors 26 and 32 and leads 34. The chip 18 could comprise control circuitry for generating control signals responsive to the ambient humidity. The humidity meter and chip 18 could be used, for example, to control air conditioning apparatus to maintain a proper environment in residential or commercial buildings.

Figure 4C:
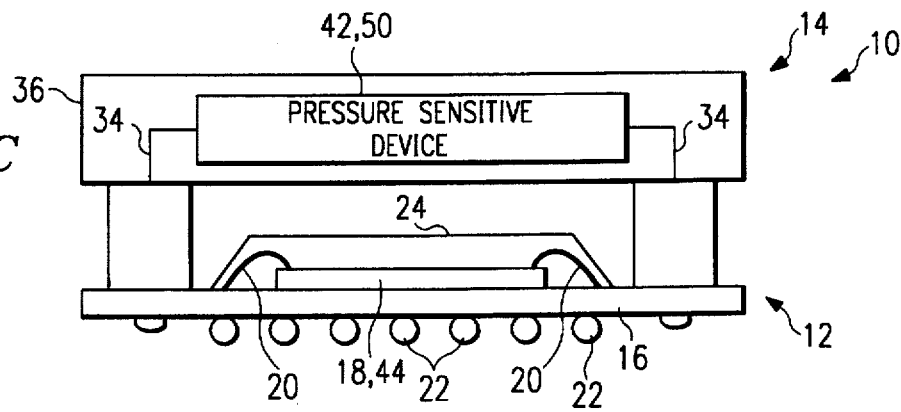

FIG. 4c illustrates a cross;sectional view of a package 10 having an upper module 14 including a pressure meter 50. The pressure meter 50 is coupled to the chip 18 through connectors 26 and 32 and leads 34. The chip 18 could comprise control circuitry for generating control signals responsive to the ambient air pressure. The pressure meter could be used, for example, to enable certain equipment responsive to a change in air pressure or when a predetermined air pressure is reached.

Figure 4D:
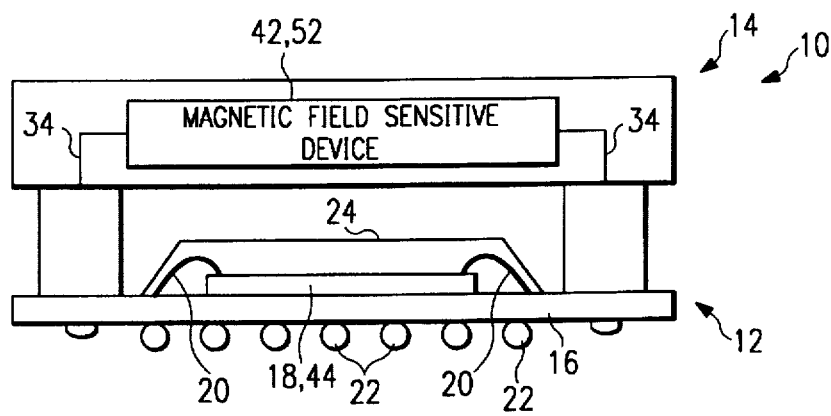

FIG. 4d illustrates a cross-sectional view of a package 10 having an upper module 14 including a magnetic field sensitive device 52, such as a magnetic field meter. The magnetic field meter 52 is coupled to the chip 18 through connectors 26 and 32 and leads 34. The chip 18 could comprise control circuitry for generating control signals responsive to a magnetic field. The magnetic field meter 52 could be used, for example, to detect magnetic devices on an assembly line or as part of security equipment in a retail store to detect shoplifted goods. The chip could processes the information from the magnetic field meter 52 to distinguish parts or to identify security tags.

It should be noted that other data acquisition components 42 could be used in the upper module 14 as well. This aspect of the invention provides significant advantages over the prior art. First, as described hereinabove, the replaceable upper module allows the data acquisition components to be coupled to the circuitry after surface mounting, thereby protecting the components from damage. Second, the upper module 14 allows easy replacement of a part which may fail or become inaccurate over time. Third, a single lower module 12 can be used with a plurality of upper modules for customization purposes. For example, a number of upper modules could be made available with data acquisition components of various sensitivities. Thus, a package 10 having a thermistor could be used with one upper module type for regulating temperature in a commercial setting and also used with another upper module type, having a highly sensitive thermistor, in a hospital or laboratory setting where accurate temperatures must be maintained within a narrow tolerance.

Figure 5:
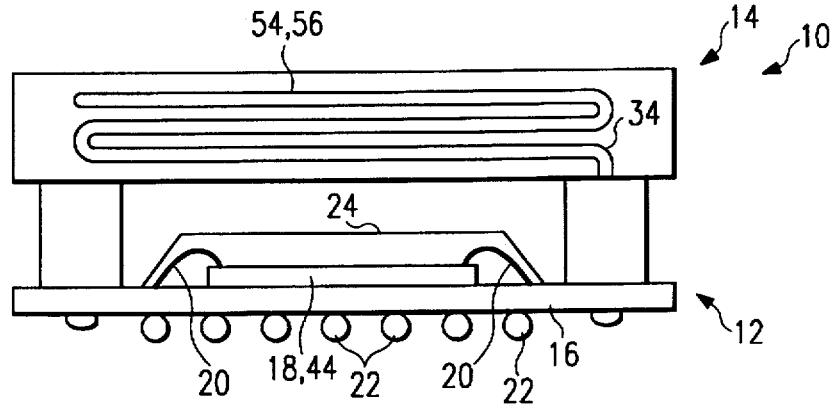
FIG. 5 illustrates a cross sectional view of a package incorporating a communications device in the upper module of the package.

FIG. 5 illustrates one embodiment of the present invention wherein the upper module 14 contains one or more components 54 for wireless communication and the lower component contains circuitry for processing data from the wireless communication component or components. Again, while the packages 10 of FIG. 5 is shown with a single wireless communication component housed therein, it is apparent that multiple wireless communication or combinations of wireless communication and other components could be stored in a single upper module.

In FIG. 5 the upper module 14 houses an antenna 56 for receiving communication signals. The chip 18 processes the signals received by the antenna. The chip might include, for example, analog circuitry for conditioning receiving (or emitting) the communications signals and digital circuitry for processing the data received or sent. This type of package would be useful in a number of areas. First, a package could be used in conjunction with PCMCIA boards (used primarily in portable computers) for providing wireless modem communications. Having both the processing circuitry and the antenna in a single package reduces the cost and complexity of producing such a board. Another application would be in GPS (Geostationary Positioning Station) devices, where the package provides a single chip solution for use in automotive, marine and similar applications.

Figure 6A:
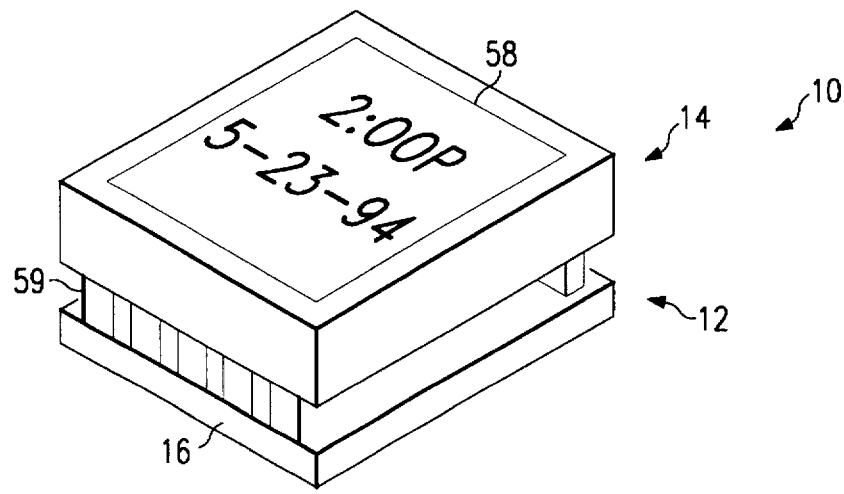
FIGS. 6a–6c illustrate views of packages incorporating output devices in the upper module of the package.
Figure 6B:
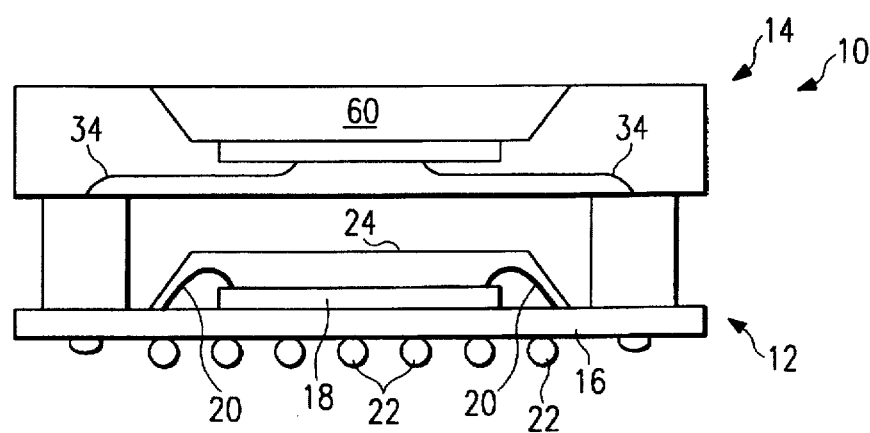
Figure 6C:
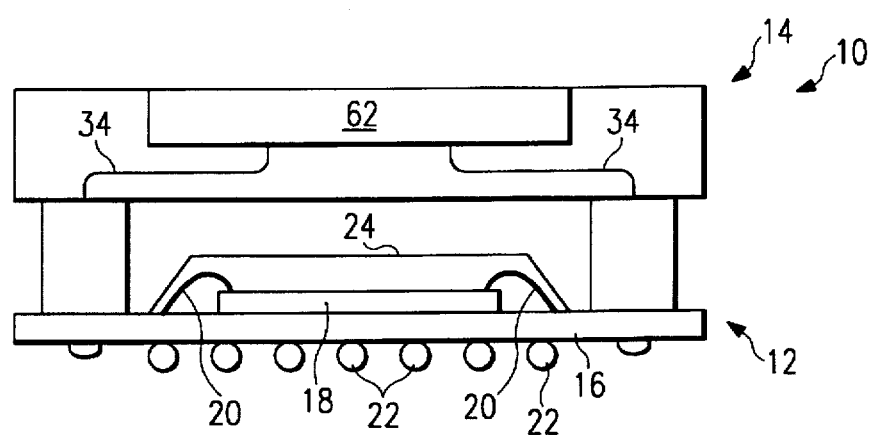

FIGS. 6a–6c illustrate embodiments of the present invention wherein the upper module 14 contains one or more components for information output and the lower component contains circuitry for processing and conditioning data to the output component or components. Again, while the packages 10 of FIG. 5 is shown with a single output component housed therein, it is apparent that multiple output components and combinations with output components and other components could be stored in a single upper module 14.

In FIG. 6a the upper module contains a display device 58 such as a LCD (liquid crystal display) or LED (light emitting diode) display. The chip 18 could be one of a desirable. For exponents for which a display 58 would be desirable. For example, in one application, chip 18 could contain a clock circuit and the display device 58 could output the date and time in another application, the display device could output the value of one or more registers of a microprocessor or microcontroller. In yet another application, the display device 58 could output status signals for a modem chip. The uses of such a display 58 are unlimited.

In FIG. 6a, multiple signals are communicated to the display device 58 through connector 59. Ground and power signals are used to power the display from the lower module 12. It is assumed that the display 58 includes circuitry to translate and buffer serial signals from the lower module 12. Alternatively, additional connections could be used to provide parallel communication of data between the display device 58 and the chip 18.

FIG. 6b illustrates an upper module with an audio output device 60, such as a speaker or buzzer, to provide audio output from the chip 18. The audio output device could be used to provide manufacturers with an easy to assemble solution. For example, the output device could be used with a radio-frequency receiver chip or with a DSP (digital signal processor) chip in connection with a hand held game. Another application would be in a personal computer to reduce manufacturing costs.

FIG. 6c illustrates an upper module with a vibrating apparatus 62 to provide a tactile signal, such as a vibrating device, responsive to a control signal from chip 18. This device could be used, for example, in connection with pager circuitry to notify a user of an incoming message.

This aspect of the invention as shown in FIG. 6a–6c provides significant advantages over the prior art. First, as described hereinabove, the replaceable upper module allows the output components to be coupled to the circuitry after surface mounting, thereby protecting the components from damage. Second, the upper module 14 allows easy replacement of a part which may fail over time. Third, the packages can provide an easy to assemble solution for a manufacturer.

Figure 7:
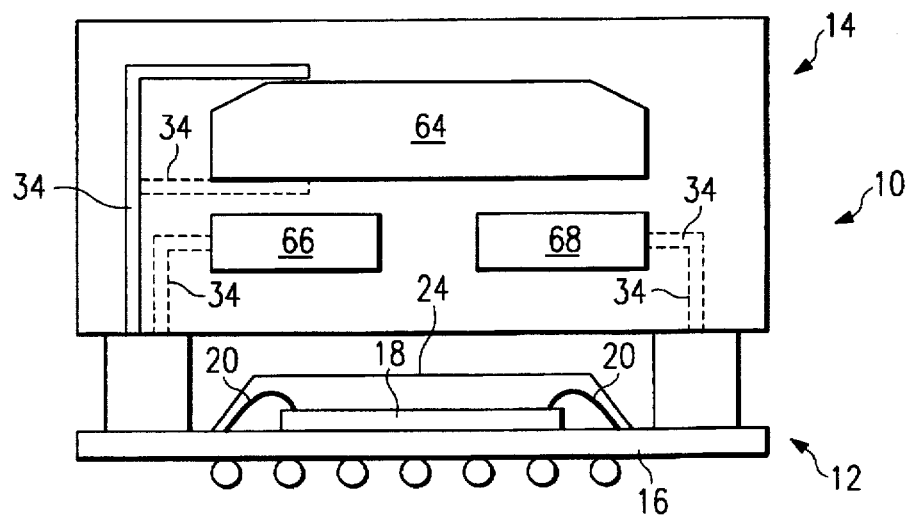
FIG. 7 illustrates a cross-sectional view of package incorporating a battery and two crystals in the upper module of the package.

FIG. 7 illustrates a cross-sectional view of a package with an upper module 14 containing a battery 64 and two crystals 66 and 68 (one for the system and one for the real time clock) to be used in a computer system. The chip 18 would include the conditioning circuitry for producing the system clock signal for distribution throughout the computer system and the real time clock circuitry for providing time and date outputs. Such a circuit would reduce the cost of producing a computer motherboard and would provide the aforementioned benefits in fabrication of the motherboard using surface mount technology.

Two or more of the embodiments shown in connection with FIGS. 4a–4d and 5, 6a–6c and 7 could be combined. For example, the embodiment of FIG. 7 could be combined with the thermistor of FIG. 4a. Other combinations may be equally beneficial.

Although the Detailed Description of the invention has been directed to certain exemplary embodiments, various modifications of these embodiments, as well as alternative embodiments, will be suggested to those skilled in the art. For example, different components from those shown could be housed in the upper module 14. Further, connectors of various configurations could be used to couple the upper module 14 to the lower module 12. Other connector schemes using mechanical connectors to hold the upper module 14 to the lower module 12 are shown in U.S. application Ser. No. 08/114,750 and U.S. application Ser. No. 08/225,227, referenced above.

The invention encompasses any modifications or alternative embodiments that fall within the scope of the Claims.

What is claimed is:

1. An integrated circuit package comprising:
    an upper module comprising:
        a housing;
        a data acquisition component disposed within said housing for acquiring environmental data; and
        upper module connection circuitry for providing electrical connections to said data acquisition component; and
    a lower module comprising:
        a substrate;
        an array of connectors on a surface of said substrate, to provide physical and electrical connections between said lower module and a circuit board when soldered to said circuit board;
        a processing circuit coupled to said substrate; and
        lower module connection circuitry electrically coupled to said processing circuit for providing detachable connections with said upper module connection circuitry, such that said processing circuitry can process the environmental data.

2. The integrated circuit package of claim 1 wherein said data acquisition component comprises an temperature sensitive device.

3. The integrated circuit package of claim 2 wherein the temperature sensitive device comprises a thermistor.

4. The integrated circuit package of claim 2 wherein the temperature sensitive device comprises a thermo-coupler.

5. The integrated circuit package of claim 1 wherein the data acquisition component comprises a humidity sensitive device.

6. The integrated circuit package of claim 5 wherein the processing circuitry comprises control circuitry for generating control signals responsive to ambient humidity.

7. The integrated circuit package of claim 1 wherein the processing circuitry comprises a pressure sensitive device.

8. The integrated circuit package of claim 7 wherein the processing circuitry comprises control circuitry for generating control signals responsive to ambient air pressure.

9. The integrated circuit package of claim 7 wherein the processing circuitry comprises control circuitry for generating control signals responsive to a magnetic field.

10. The integrated circuit package of claim 1 wherein the processing circuitry comprises a magnetic field sensitive device.

11. The integrated circuit package of claim 1, wherein said array of connectors is a ball-grid array.

12. An integrated circuit package comprising:
   an upper module comprising:
      a housing;
      a wireless communications device disposed within said housing; and upper module connection circuitry for providing electrical connections to said wireless communications device; and
   a lower module comprising:
      a substrate;
      an array of connectors on a surface of said substrate, to provide physical and electrical connections between said lower module and a circuit board when soldered to said circuit board;
      a processing circuit coupled to said substrate; and
      lower module connection circuitry electrically coupled to said processing circuit for providing detachable connections with said upper module connection circuitry.

13. The integrated circuit package of claim 12 wherein said wireless communications device comprises an antenna.

14. The integrated circuit package of claim 13 wherein said processing circuit comprises analog circuitry for processing signals received by said antenna.

15. The integrated circuit package of claim 14 wherein said processing circuit further comprises digital circuitry for processing signals from said analog circuits.

16. The integrated circuit package of claim 15 wherein said digital circuitry comprises geostationary positioning circuitry.

17. The integrated circuit package of claim 13 wherein said processing circuit comprises analog circuitry for processing signals to be transmitted by said antenna.

18. The integrated circuit package of claim 17 wherein said processing circuit further comprises digital circuitry for processing signals to be sent to said analog circuitry.

19. The integrated circuit package of claim 12, wherein said array of connectors is a ball-grid array.

20. An integrated circuit package comprising:
   an upper module comprising:
      a housing;
      an output device disposed within said housing, said output device comprising a user interface device; and
      upper module connection circuitry for providing electrical connections to said output device; and
   a lower module comprising;
      a substrate;
      an array of connectors on a surface of said substrate, to provide physical and electrical connections between said lower module and a circuit board when soldered to said circuit board;
      a processing circuit coupled to said substrate; and
      a lower module connection circuitry electrically coupled to said processing circuit for providing detachable connections with said upper module connection circuitry, said connections allowing said processing circuit to communicate through said output device.

21. The integrated circuit package of claim 20 wherein said output device comprises a speaker.

22. The integrated circuit package of claim 20 wherein said output device comprises a display.

23. The integrated circuit package of claim 20 wherein said output device comprises a device for providing a tactile signal.

24. The integrated circuit package of claim 23 wherein said device for providing a tactile signal comprises a vibrating device.

25. The integrated circuit package of claim 20 wherein said output device comprises a buzzer.

26. The integrated circuit package of claim 20 wherein the processing circuit comprises a digital signal processing device.

27. The integrated circuit package of claim 20, wherein said array of connectors is a ball-grid array.

28. An integrated circuit package comprising:
   an upper module comprising:
      a housing;
      a battery disposed within said housing;
      a first crystal for providing clock signals to a real time clock;
      a second crystal for providing clock signals for a system clock; and upper module connection circuitry for providing electrical connections to said battery and first and second crystal; and
   a lower module comprising:
      a substrate;
      an array of connectors on a surface of said substrate, to provide physical and electrical connections between said lower module and a circuit board when soldered to said circuit board;
      a processing circuit coupled to said substrate; and
      lower module connection circuitry electrically coupled to said processing circuit for providing detachable connections with said upper module connection circuitry.

29. The integrated circuit package of claim 28 wherein said processing circuit comprises real time clock circuitry for providing a time and date outputs and clock circuitry for providing a system clock signal.

30. The integrated circuit package of claim 28, wherein said array of connectors is a ball-grid array.

31. An integrated circuit package, comprising:
   an upper module and
   a lower module;
   wherein said lower module comprises:
      a substrate;
      a ball grid array, attached to a surface of said substrate, which, when reflowed, will provide connection to conductors on a printed circuit board;
      an integrated circuit coupled to said substrate;
      lower module connection circuitry electrically coupled to said processing circuit for providing detachable connections with said upper module; and
   wherein said upper module comprises:
      a housing;
      a component, disposed within said housing, which can be damaged by the temperatures to which said lower module is subjected when said ball grid array is reflowed; and
      upper module connection circuitry for providing electrical connections between said component and said lower module.

32. The integrated circuit package of claim 31, wherein said component comprises a temperature-sensitive device.

33. The integrated circuit package of claim 31, wherein said component comprises a humidity-sensitive device.

34. The integrated circuit package of claim 31, wherein said component comprises geostationary positioning circuitry.

35. The integrated circuit package of claim 31, wherein said component comprises a display.

36. The integrated circuit package of claim 31, wherein said component comprises a battery.

* * * * *